United States Patent
Wang et al.

(10) Patent No.: US 6,852,594 B1
(45) Date of Patent: Feb. 8, 2005

(54) TWO-STEP SOURCE SIDE IMPLANT FOR IMPROVING SOURCE RESISTANCE AND SHORT CHANNEL EFFECT IN DEEP SUB-0.18µM FLASH MEMORY TECHNOLOGY

(75) Inventors: Zhigang Wang, San Jose, CA (US); Yue-Song He, San Jose, CA (US); Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/053,256

(22) Filed: Jan. 18, 2002

(51) Int. Cl.[7] .................................. H01L 21/336
(52) U.S. Cl. ................. 438/257; 438/259; 257/315
(58) Field of Search .................. 438/257, 264, 438/265, 286, 303, 304, 453, 597, 598; 257/315, 316, 320, 322

(56) References Cited

U.S. PATENT DOCUMENTS 6,130,452 A  *  10/2000  Lu et al. ..................... 257/315
6,265,265 B1 *  7/2001  Lim ............................ 438/257

* cited by examiner

Primary Examiner—David Nelms
Assistant Examiner—Dung A. Le

(57) ABSTRACT

Methods of forming flash memory EEPROM devices having lightly doped source region near the critical gate region and a heavily doped source region away from the critical gate region. In a first embodiment a first source mask is formed exposing source regions and portions of the gates and implanting n dopant ions, replacing the first source mask with a second source mask that exposes a portion of the source regions and implanting n[+] dopant ions. In a second embodiment a source mask is formed exposing a portion of the source regions and implanting n[+] dopant ions.

7 Claims, 6 Drawing Sheets

TWO-STEP SOURCE SIDE IMPLANT FOR IMPROVING SOURCE RESISTANCE AND SHORT CHANNEL EFFECT IN DEEP SUB-0.18µM FLASH MEMORY TECHNOLOGY

BACKGROUND OF THE INVENTION

1. Field of the Invention

This invention relates generally to the art of microelectronic integrated circuits. More specifically, this invention relates to high performance microelectronic flash memory cells and to the art of manufacturing high performance microelectronic flash memory cells. Even more specifically, this invention relates to high performance microelectronic flash memory cells with reduced source resistance and improved short channel effect in deep sub-0.18 µm flash memory technology.

2. Discussion of the Related Art

A microelectronic flash or block erase Electrically Erasable Programmable Read-Only Memory (Flash EEPROM) includes an array of cells that can be independently programmed and read. The size of each cell and thereby the memory array are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells in either a column or a row are connected together and each column or row common source connections are then connected to a common source voltage $V_{ss}$. This arrangement is known as a NOR flash memory configuration.

A cell is programmed by applying a voltage, typically 9 volts to the control gate, applying a voltage of approximately 5 volts to the drain and grounding the common voltage source $V_{ss}$, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the common source voltage $V_{ss}$, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, a cell is erased by applying a relatively high voltage, typically 12 volts, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of minus 10 volts to the control gate, applying 5 volts to the source and allowing the drain to float. Another method of erasing is by applying 5V to the P-well and minus 10V to the control gate while allowing the source/drain to float.

However, as the dimensions of the flash memory array have been aggressively scaled down and the product arrays produced with ultra high density, the greatest challenge for deep sub-0.18µm high performance non-volatile memory cell design is to control the short channel dimension in order to control the short channel effects, such as $V_t$ rolloff, high DIBL and excess column leakage, accompanied with less tolerance of the polysilicon gate length variation across the product array.

Therefore, what is needed is a method of providing a lightly doped source junction near the critical gate region and a heavily doped source junction away from the critical gate region in such a way that the lateral diffusion is decreased while maintaining a low $V_{ss}$ resistance.

SUMMARY OF THE INVENTION

According to the present invention, the foregoing and other objects and advantages are obtained by a method of manufacturing flash memory devices having lightly doped source regions near the critical gate region and heavily doped source regions away from the critical gate region.

In accordance with one aspect of the invention, in a first embodiment a first source mask is formed exposing source regions and portions of the gates and n dopant ions are implanted in the exposed regions. The first source mask is removed and a second source mask is formed exposing a portion of the source regions and $n^+$ dopant ions are implanted in the exposed regions.

In accordance with another aspect of the invention, in a second embodiment a source mask is formed exposing a portion of the source regions and $n^+$ ions are implanted in the exposed regions.

The described method thus controls short channel effects such as $V_t$ rolloff, high DIBL and excess column leakage with less gate length variation across the product array.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1A is a top view of a portion of a flash memory device showing the position of a first source mask formed on the portion of the flash memory device;

FIG. 1B is a cross sectional view of the portion of the flash memory device shown in FIG. 1A being implanted with n⁺ ions;

FIG. 1C is a cross sectional view of the portion of the flash memory device as shown in FIG. 1B with the first source mask removed, a second source mask formed and being implanted with n ions;

FIG. 1D is the portion of the flash memory device as shown in FIG. 1C with the second source mask removed and after an anneal process that has driven the n ions into the substrate forming a final dopant profile;

FIG. 2A is a top view of a portion of a flash memory device showing the position of a first source mask formed on the portion of the flash memory device;

FIG. 2B is cross sectional view of the portion of the flash memory device as shown in FIG. 2A being implanted with n ions;

FIG. 2C is a top view of the portion of the flash memory device as shown in FIG. 2A showing the position of a second source mask formed on the portion of the flash memory device;

FIG. 2D is a cross sectional view of the portion of the flash memory device as shown in FIG. 2C being implanted with n⁺ ions;

FIG. 2E shows the portion of the flash memory device as shown in FIG. 2D with the second source mask removed and after an anneal process that has driven the n ions into the substrate forming a desired dopant profile;

FIG. 3A is a top view of a portion of a flash memory device showing the position of a source mask formed on the portion of the flash memory device;

FIG. 3B is a cross sectional view of the portion of the flash memory device as shown in FIG. 3A being implanted with n⁺ ions; and FIG. 3C shows the portion of the flash memory device as shown in FIG. 3B with the source mask removed and after an anneal process that has driven the n⁺ ions into the substrate forming a desired dopant profile.

DETAILED DESCRIPTION

Reference is now made in detail to a specific embodiment or specific embodiments of the present invention that illustrate the best mode or modes presently contemplated by the inventors for practicing the invention.

Figure 1A:
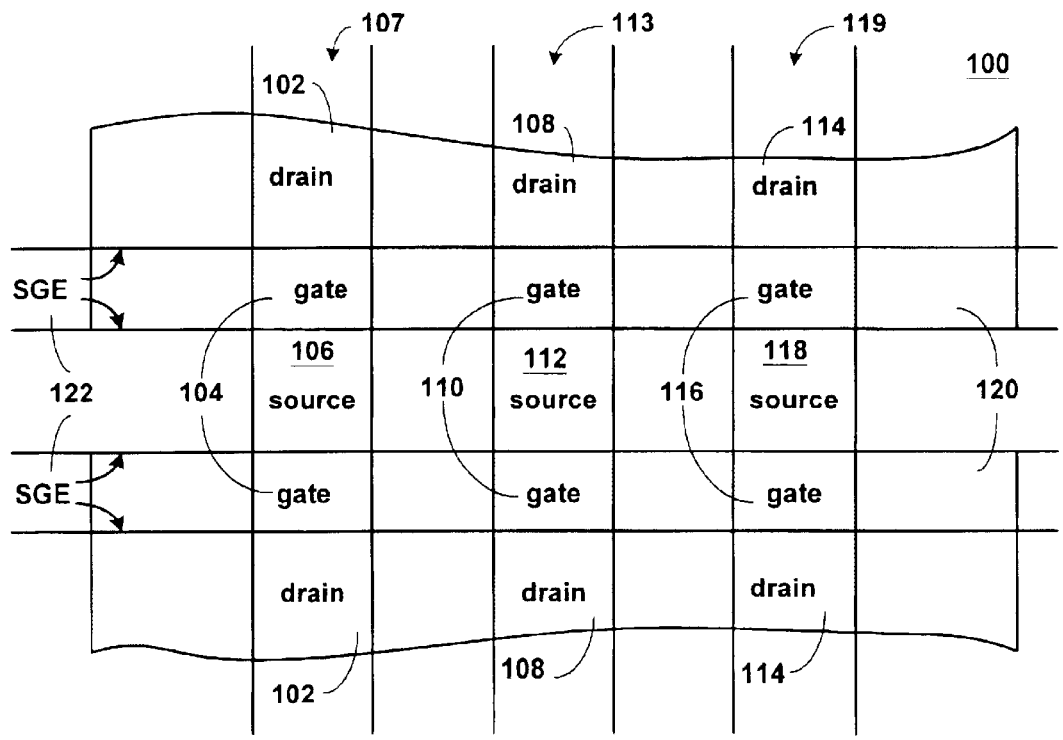
FIGS. 1A–1D show a prior art source side implant process.

FIGS. 1A–1D illustrate selected steps of a prior art source side implant process. FIG. 1A is a top view of a portion 100 of a semiconductor flash memory. The portion 100 of the semiconductor flash memory shows the drain regions 102, the gates 104, and the shared source region 106 of a first pair of transistors 107, the drain regions 108, the gates 110, and the shared source region 112 of a second pair of transistors 113, and the drain regions 114, the gates 116, and the shared source region 118 of a third pair of transistors 119. The shaded portion indicates a first source mask 120 formed on the portion 100 of the semiconductor flash memory. The lines (Stacked Gate Edge) SGE 122 indicate the edges of the gates 104, 110 and 116. The edge of the shaded portion of the first source mask 120 coincides with the edges of the SGE 122 adjacent the shared source regions 106, 112 and 118.

Figure 1B:
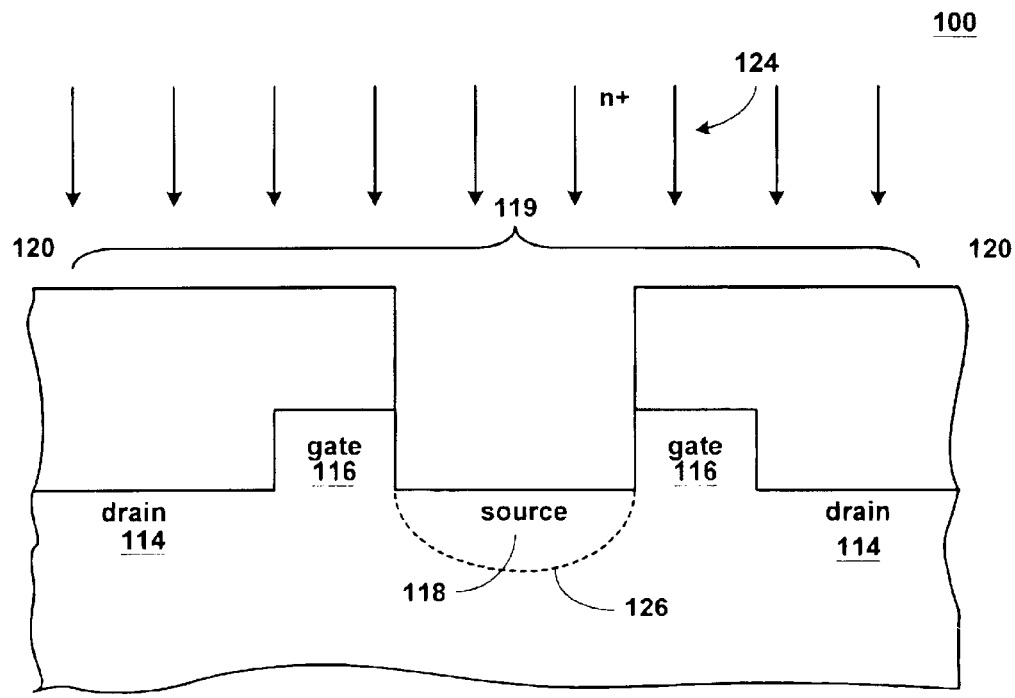

FIG. 1B is a cross sectional view of the portion 100 of the semiconductor memory as shown in FIG. 1A showing the drain regions 114, the gates 116 and the shared source 118 of the third pair of transistors 119. The portion 100 of the semiconductor memory is shown being implanted with n⁺ ions indicated by the arrows 124. The dotted line 126 indicates the initial profile of the n⁺ ions as implanted.

Figure 1C:
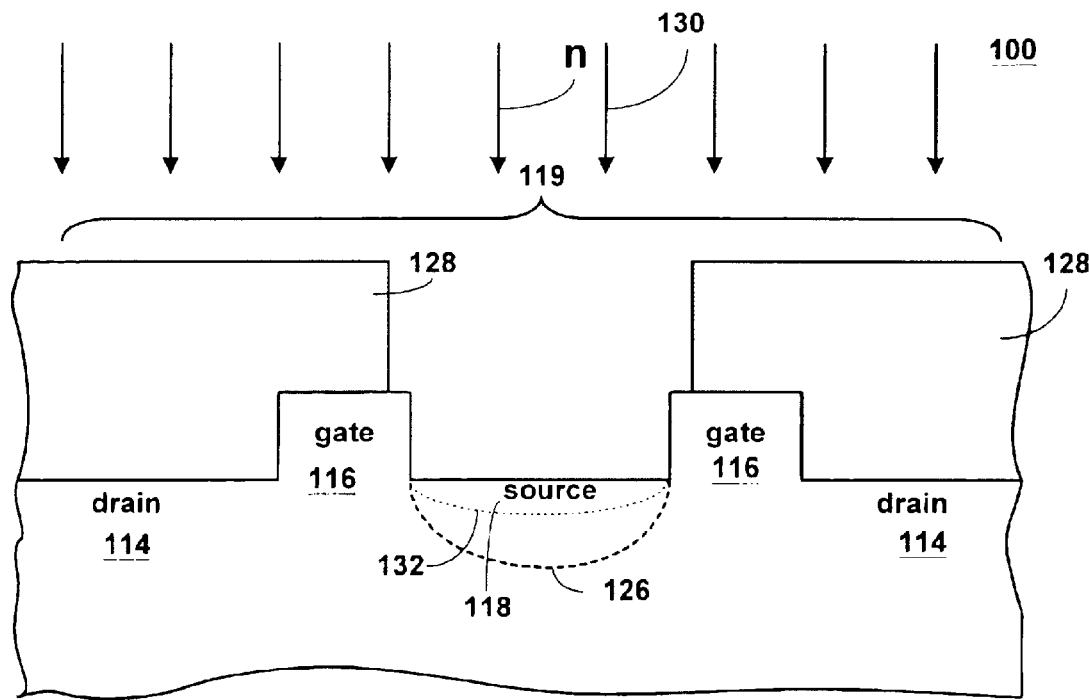

FIG. 1C is the cross sectional view of the portion 100 of the flash memory device as shown in FIG. 1B with the first source mask 120 (FIGS. 1A & 1B) removed and a second source mask 128 formed on the portion 100 of the flash memory device. The portion 100 of the semiconductor memory is shown being implanted with n ions indicated by the arrows 130. The dotted line 132 indicates the initial dopant profile of the n ions as implanted. As is known in the semiconductor manufacturing art, an n⁺ or an n indicates the concentration and energy of the implantation of ions into a semiconductor device. The n⁺ indicates a heavy or high dosage and is typically an implantation of arsenic ions. The n indicates a relatively light dosage and is typically phosphorus ion, however the light dosage could also be arsenic ions.

Figure 1D:
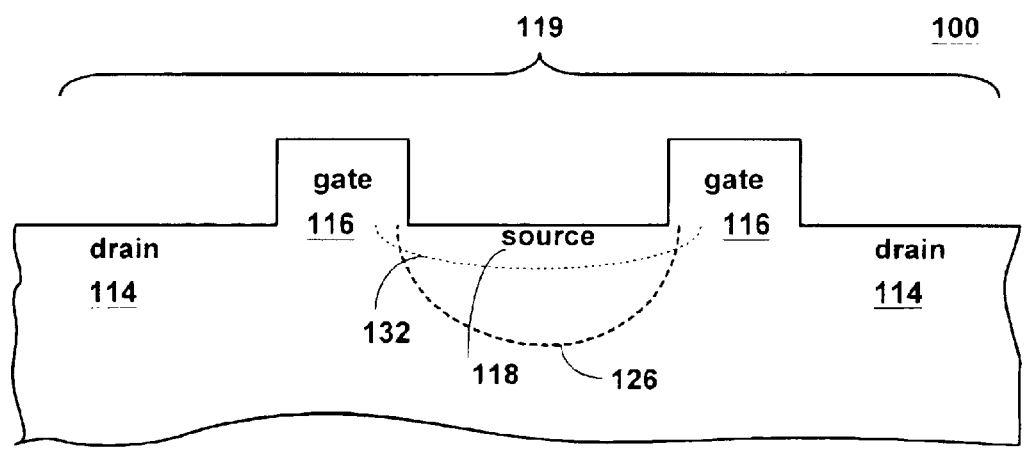

FIG. 1D is portion 100 of the flash memory device as shown in FIG. 1C with the second source mask 128 (FIG. 1C) removed and after an anneal process that has driven the n⁺ and n ions into the substrate to form the final dopant profile. It should be noted that the n⁺ and n ions extend beyond the edge of the gate 116 toward the drain regions 114. Because of the extension of the n⁺ and n profile underneath the gates 116 the channel formed underneath the gates 116 is shortened.

Figure 2A:
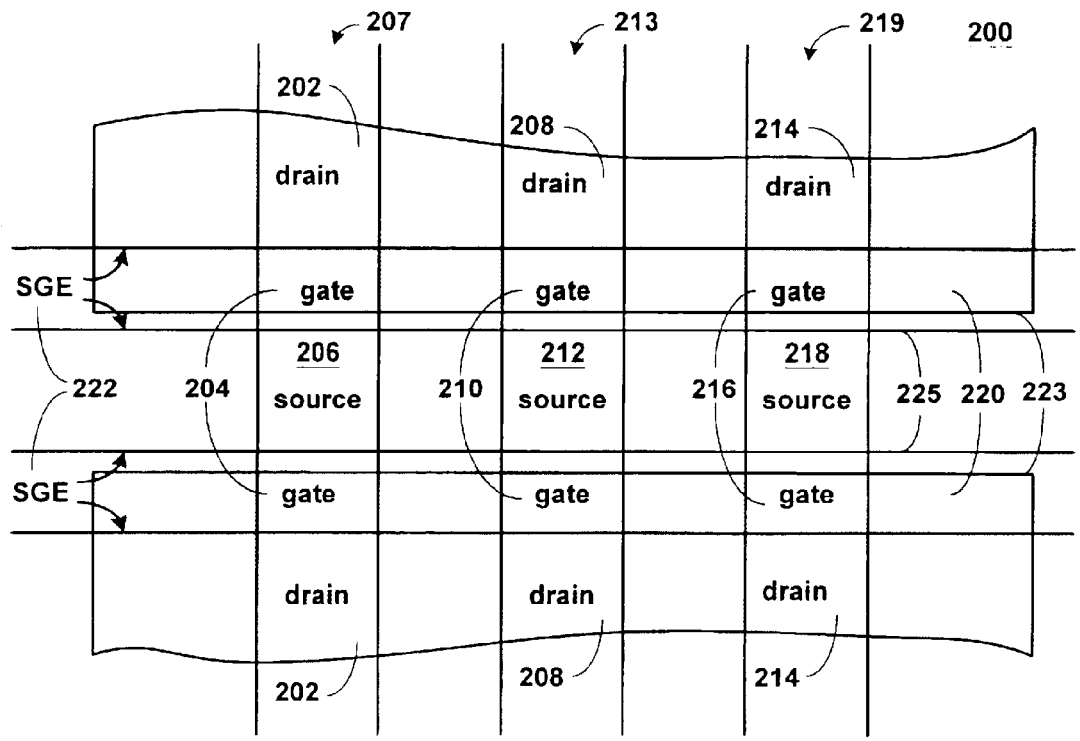
FIGS. 2A–2E show a first embodiment of a source side implant process in accordance with the present invention.

FIGS. 2A–2E show a first embodiment of a source side implant process in accordance with the present invention. FIG. 2A is a top view of a portion 200 of a semiconductor flash memory. The portion 200 of the semiconductor flash memory shows the drain regions 202, the gates 204, and the shared source region 206 of a first pair of transistors 207, the drain regions 208, the gates 210, and the shared source region 212 of a second pair of transistors 213, the drain regions 214, the gates 216, and the shared source region 218 of a third pair of transistors 219. The shaded portions indicate a first source mask 220 formed on the portion 200 of the semiconductor flash memory. The lines (Stacked Gate Edge) SGE 222 indicate the edges of the gates 204, 210 and 216. The edge 223 of the shaded portion of the first source mask 220, unlike the prior art process shown in FIG. 1A, does not coincide with the edges 225 of the SGE 222 adjacent the shared source regions 206,212 and 218.

Figure 2B:
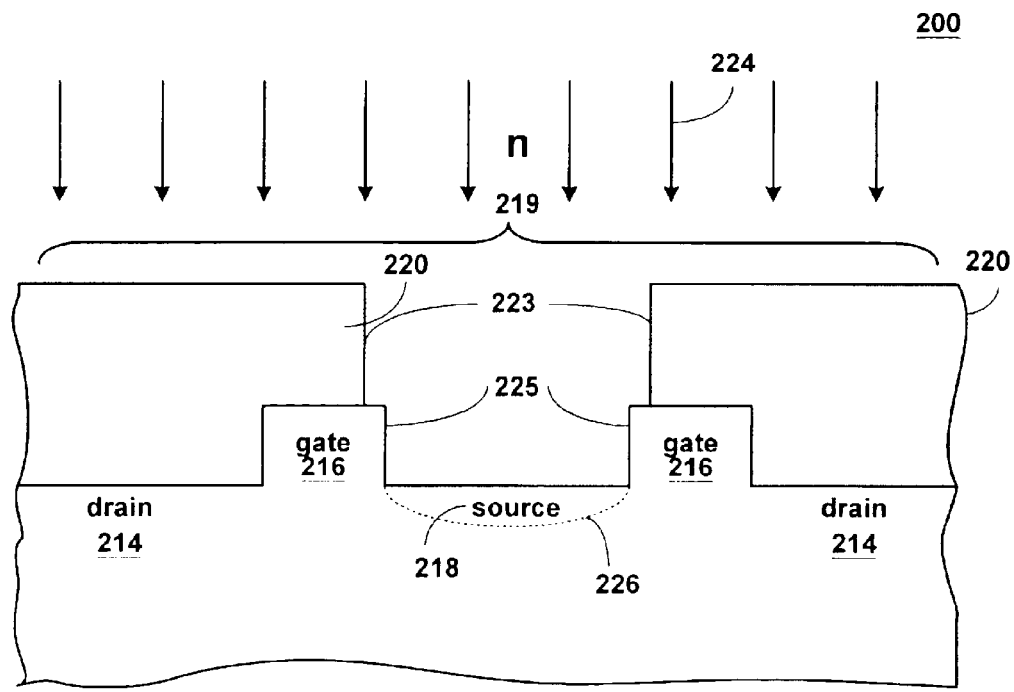

FIG. 2B is a cross sectional view of the portion 200 of the semiconductor memory as shown in FIG. 2A showing the drain regions 214, the gates 216 and the shared source 218 of the third pair of transistors 219. The portion 200 of the semiconductor memory is shown being implanted with n ions indicated by the arrows 224. The dotted line 226 indicates the initial profile of the n ions as implanted. The edges 223 of the first source mask are shown not coinciding with the edges 225 of the gates 216.

Figure 2C:
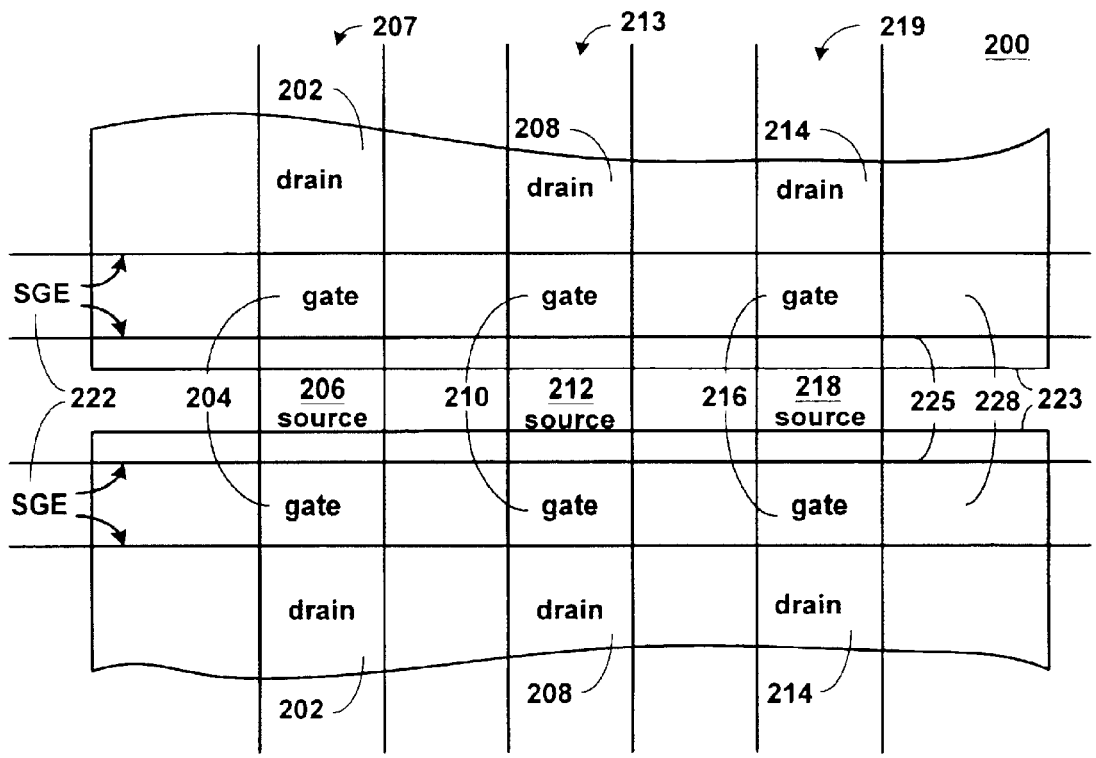

FIG. 2C is a top view of a portion 200 of a semiconductor flash memory as shown in FIG. 2A with the first source mask 220 removed and a second source mask 228 formed on the portion 200 of the semiconductor flash memory. However, unlike the first source mask 220 in FIG. 2A, the edges 223 of the second source mask 228 extend beyond the edges 225 of the SGE 222.

Figure 2D:
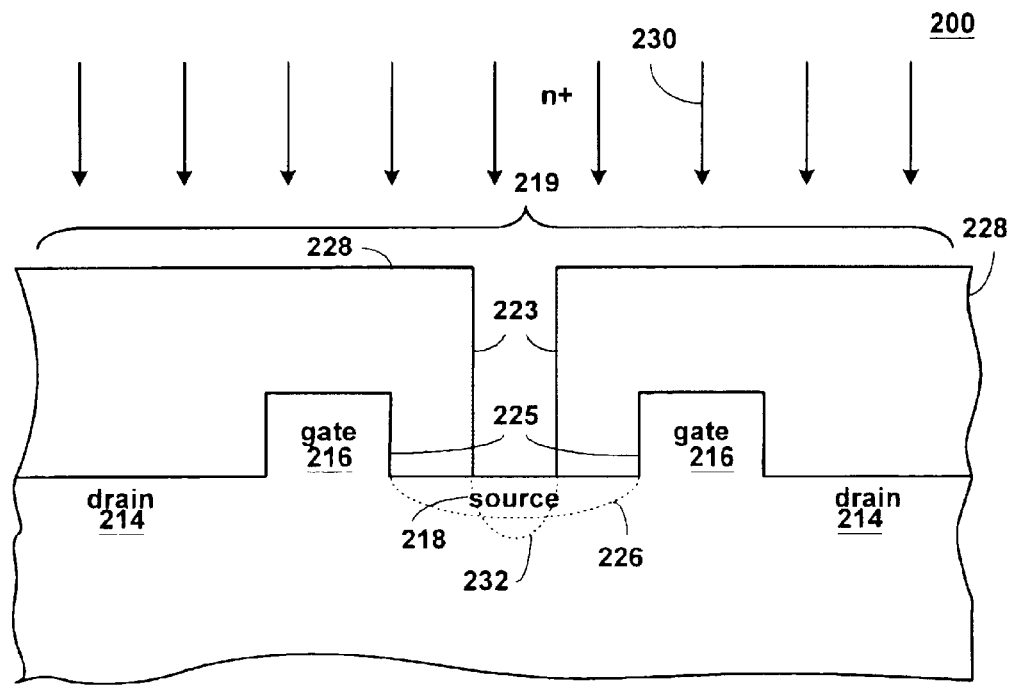

FIG. 2D is a cross sectional view of the portion 200 of the flash memory device as shown in FIG. 2C. The portion 200 of the semiconductor memory is shown being implanted with $n^+$ ions indicated by the arrows 230. The dotted line 232 indicates the initial dopant profile of the $n^+$ ions as implanted. The edges 223 of the second mask are shown not coinciding with the edges 225 of the gates 216.

Figure 2E:
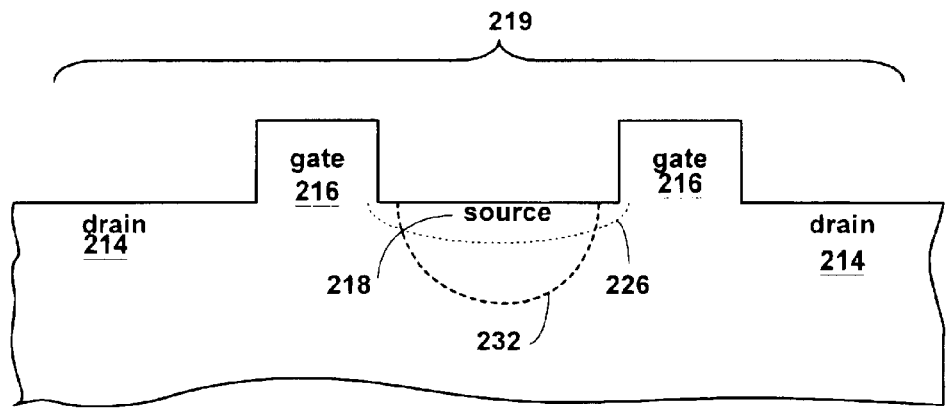

FIG. 2E is portion 200 of the flash memory device as shown in FIG. 2D with the second source mask 228 (FIG. 2D) removed and after an anneal process that has driven the $n^+$ and n ions into the substrate. It should be noted that the $n^+$ and n ions do not extend beyond the edges 225 of the gates 216 toward the drain regions 214. This allows the overall dimensions of the gate to be reduced because the channel length is not shortened underneath the gates 216.

Figure 3A:
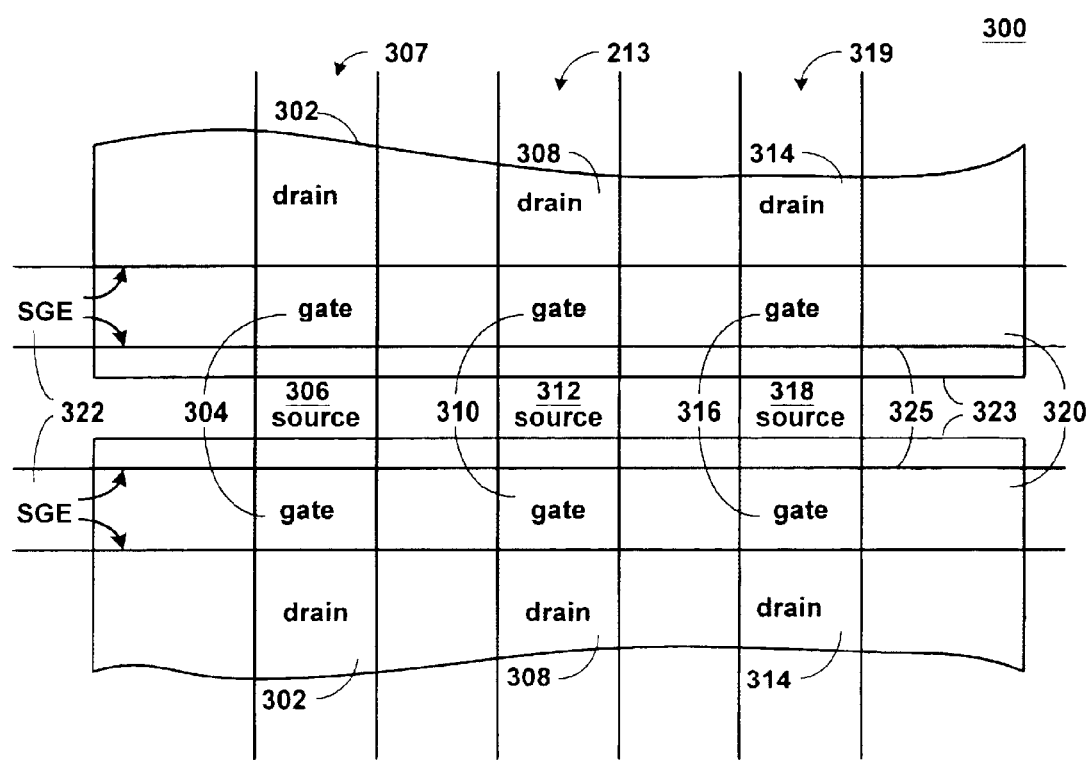
FIGS. 3A–3C show a second embodiment of a source side implant process in accordance with the present invention.
Figure 3B:
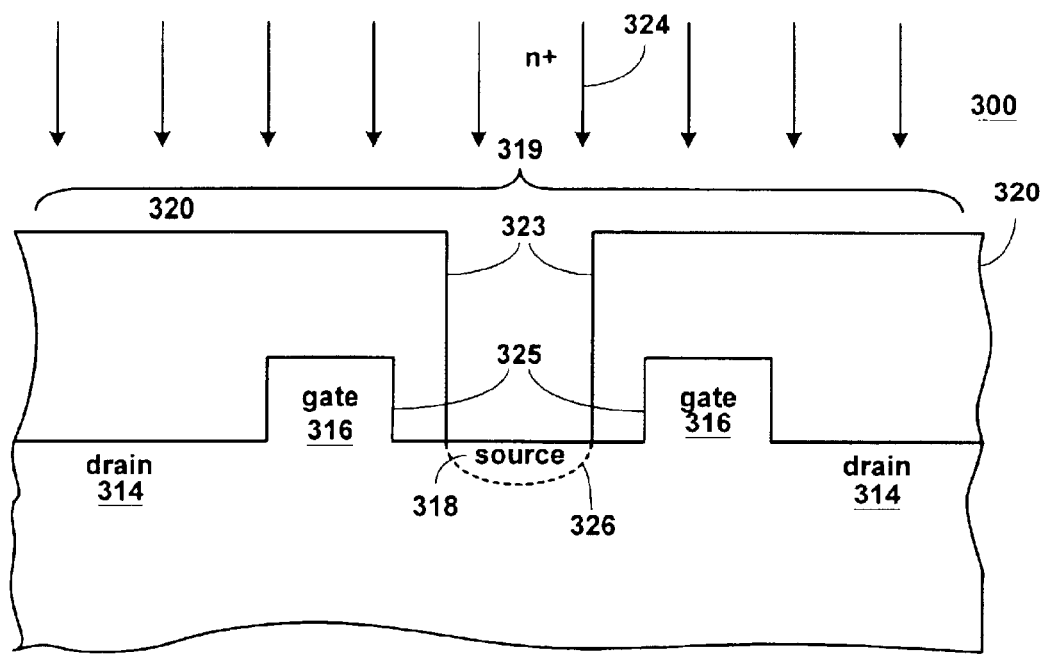
Figure 3C:
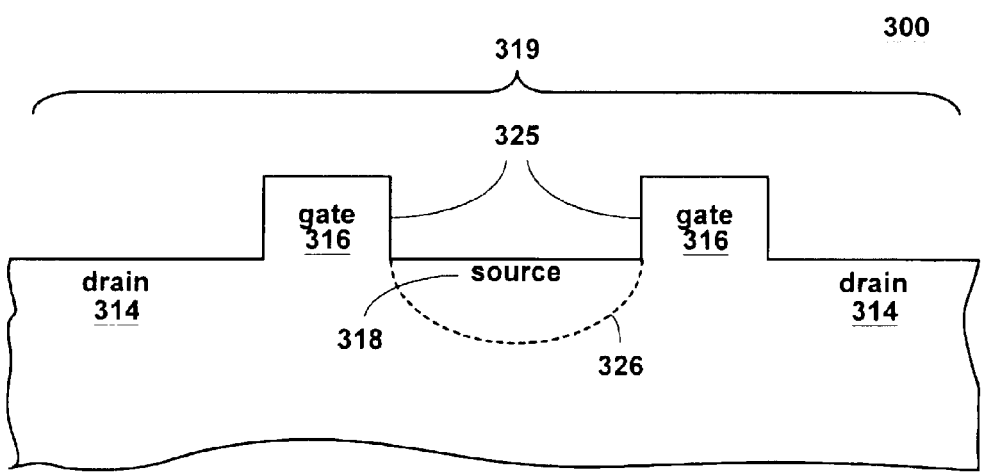

FIGS. 3A–3C show a second embodiment of a source side implant process in accordance with the present invention. FIG. 3A is a top view of a portion 300 of a semiconductor flash memory. The portion 300 of the semiconductor flash memory shows the drain regions 302, the gates 304, and the shared source region 306 of a first pair of transistors 307, the drain regions 308, the gates 310, and the shared source region 312 of a second pair of transistors 313, the drain regions 314, the gates 316, and the shared source region 318 of a third pair of transistors 319. The shaded portions indicate a source mask 320 formed on the portion 300 of the semiconductor flash memory. The lines (Stacked Gate Edge) SGE 322 indicate the edges of the gates 304, 310 and 316. The edge 323 of the shaded portion of the first source mask 320, unlike the prior art process shown in FIG. 1A, does not coincide with the edges 325 of the SGE 322 adjacent the shared source regions 306, 312 and 318.

FIG. 3B is a cross sectional view of the portion 300 of the semiconductor memory as shown in FIG. 3A showing the drain regions 314, the gates 316 and the shared source 318 of the third pair of transistors 319. The portion 300 of the semiconductor memory is shown being implanted with $n^+$ ions indicated by the arrows 324. The dotted line 326 indicates the initial profile of the $n^+$ ions as implanted. The edges 323 of the source mask are shown not coinciding with the edges 325 of the gates 316.

FIG. 3C is portion 300 of the flash memory device as shown in FIG. 3B with the source mask 320 (FIG. 3B) removed and after an anneal process that has driven the $n^+$ ions into the substrate. It should be noted that the $n^+$ ions do not extend beyond the edges 325 of the gates 316 toward the drain regions 314. This allows the overall dimensions of the gate to be reduced because the channel length is not shortened underneath the gates 316.

In summary, the described method controls short channel effects such as $V_t$ rolloff, high DIBL and excess column leakage with less gate length variation across the product array.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a flash memory Electrically-Erasable Programmable Read Only Memory (EEPROM) device having a lightly-doped source region near the critical gate region and a heavily-doped source region away from the critical gate region wherein the lateral diffusion of the source dopants is decreased and having low $V_{ss}$ resistance, and wherein the EEPROM includes a multitude of field effect transistor memory cells each having a source, drain, a floating gate, a control gate and a substrate, the method comprising:

(a) forming multiple gates on a substrate defining drain regions and source regions associated with each of the multiple gates;

(b) forming a first source mask exposing the source regions and portions of the gates;

c) implanting the exposed source regions with n dopant ions;

d) removing the first source mask;

e) forming a second mask exposing a portion of the source and covering a top surface of the gates;

f) implanting the exposed portions of the source region with $n^+$ dopant ions; and g) removing the second source mask.

2. The method of claim 1 further comprising annealing the device.

3. The method of claim 1 wherein step (c) is accomplished by implanting n dopant ions at a low dosage and at low energy.

4. The method of claim 1 wherein step (f) is accomplished by implanting n dopant ions at a high dosage and at high energy.

5. A method of manufacturing a flash memory Electrically-Erasable Programmable Read (Only Memory (EEPROM) device having a lightly-doped source region near the critical gate region and a heavily-doped source region away from the critical gate region wherein the lateral diffusion of the source dopants is decreased and having low $V_{ss}$ resistance, and wherein the EEPROM includes a multitude of field effect transistor memory cells each having a source, drain, a floating gate, a control gate and a substrate, the method comprising:

(a) forming multiple gates on a substrate defining drain regions and source regions associated with each of the multiple gates;

(b) forming a source mask exposing portions of the source region and covering a top surface of the gates;

(c) implanting the exposed portions of the source regions with $n^+$ dopant ions; and (d) removing the source mask.

6. The method of claim 5 further comprising annealing the device.

7. The method of claim 5 wherein step (c) is accomplished by implanting n dopant ions at a high dosage and at high energy.

* * * * *